United States Patent
Toh et al.

(10) Patent No.: US 8,470,700 B2
(45) Date of Patent: Jun. 25, 2013

(54) SEMICONDUCTOR DEVICE WITH REDUCED CONTACT RESISTANCE AND METHOD OF MANUFACTURING THEREOF

(75) Inventors: Eng Huat Toh, Singapore (SG); Jae Gon Lee, Singapore (SG); Chung Foong Tan, Singapore (SG); Shiang Yang Ong, Singapore (SG); Elgin Quek, Singapore (SG)

(73) Assignee: Globalfoundries Singapore Pte. Ltd., Singapore (SG)

( * ) Notice: Subject to any disclaimer, the term of this patent is extended or adjusted under 35 U.S.C. 154(b) by 174 days.

(21) Appl. No.: 12/804,487

(22) Filed: Jul. 22, 2010

(65) Prior Publication Data
US 2012/0018815 A1    Jan. 26, 2012

(51) Int. Cl.
*H01L 21/26* (2006.01)

(52) U.S. Cl.
USPC ............ 438/528; 438/659; 438/663; 438/683

(58) Field of Classification Search
USPC ....... 438/233, 528, 659, 663, 683, FOR. 196; 257/E21.438
See application file for complete search history.

(56) References Cited

U.S. PATENT DOCUMENTS

| | | | | |
|---|---|---|---|---|
| 5,624,869 A * | 4/1997 | Agnello et al. | ............... | 438/602 |
| 5,656,546 A * | 8/1997 | Chen et al. | ................... | 438/586 |
| 6,025,620 A * | 2/2000 | Kimura et al. | ................ | 257/296 |
| 6,162,713 A * | 12/2000 | Chen et al. | ................... | 438/585 |
| 6,242,348 B1 * | 6/2001 | Kamal et al. | .................. | 438/682 |
| 6,566,181 B2 * | 5/2003 | Bevk | ............................. | 438/199 |
| 7,030,451 B2 * | 4/2006 | Lee et al. | ..................... | 257/413 |
| 7,105,429 B2 * | 9/2006 | Jawarani | ....................... | 438/592 |
| 7,348,273 B2 * | 3/2008 | Matsuda | ........................ | 438/655 |
| 7,384,853 B2 * | 6/2008 | Chen et al. | .................. | 438/376 |
| 7,759,742 B2 * | 7/2010 | Chen et al. | ................... | 257/384 |
| 2002/0028542 A1 * | 3/2002 | Bevk | ............................ | 438/153 |
| 2002/0061639 A1 * | 5/2002 | Itonaga | ........................ | 438/592 |
| 2006/0240666 A1 * | 10/2006 | Hsieh et al. | ................... | 438/655 |

* cited by examiner

*Primary Examiner* — George Fourson, III
(74) *Attorney, Agent, or Firm* — Robert D. McCutcheon

(57) ABSTRACT

A method (and semiconductor device) of fabricating a semiconductor device provides a filed effect transistor (FET) with reduced contact resistance (and series resistance) for improved device performance. An impurity is implanted in the source/drain (S/D) regions after contact silicide formation and a spike anneal process is performed that lowers the schottky barrier height (SBH) of the interface between the silicide and the lower junction region of the S/D regions. This results in lower contact resistance and reduces the thickness (and Rs) of the region at the silicide-semiconductor interface.

15 Claims, 4 Drawing Sheets

SEMICONDUCTOR DEVICE WITH REDUCED CONTACT RESISTANCE AND METHOD OF MANUFACTURING THEREOF

TECHNICAL FIELD

The present disclosure relates generally to devices and methods of fabrication of semiconductor devices, and more particularly to the fabrication of field-effect transistors (FETs) with reduced contact resistance.

BACKGROUND

Complementary metal-oxide semiconductor (CMOS) device scaling is facing formidable challenges as scaling moves to the sub-50 nm range. One specific challenge that limits CMOS device performance is series resistance (Rseries). Rseries includes various components, including overlap resistance (Rov), spreading resistance (Rsp, which equals Rext+Rsd) and diffusion contact resistance (Rco). Notably, Rco is proportional to the schottky barrier height (SBH). FIG. 1 illustrates the various components (Rov, Rext, Rsd, Rco) of series resistance in a CMOS device.

Nickel silicide (NiSi) is widely employed in CMOS fabrication for use as the source/drain contact, mainly because of its low resistivity, line width effect, low Si consumption and formation temperature. However, NiSi has a high electron schottky barrier height (SBH) of between about 0.65 and 0.7 eV, which results in high contact resistance.

Because Rco and Rsp account for around 85% or more of the total Rseries in current CMOS devices and further device scaling will increase Rco such that it becomes the dominant component in Rseries, reducing contact resistance is important. Since Rco depends on SBH, reducing SBH will reduce Rseries and improve device performance.

Current techniques for reducing SBH employ impurity segregation at the NiSi/Si interface. An impurity is implanted after source/drain anneal, followed by Ni deposition and NiSi formation. The segregated layer, which could use for example impurities like As, B, N, Cl, S, Se or Al, either passivates the surface or creates interface dipoles to reduce the SBH. The main problems with such a process are that most of the impurity/dopant/metal (1) remains in the bulk of the NiSi material, and (2) may not be fully activated due to the low temperature of silicidation.

For purposes of the following discussion, we shall describe utilization of nitrogen (N) as the impurity, as N is effective in lowering SBH and is a common element used in ion implantation in current CMOS process technology. At low N concentration, surface passivation of dangling bonds help to de-pin the Fermi-level, and therefore lower SBH. While SBH is lowered significantly at high N concentration due to the formation of NiSi2 (nickel disilicide) at the interface, the resistivity Rs (sheet resistance of the material) also increases. The NiSi2 is formed at the interface because N (which is present in large amounts in the bulk silicon) retards Ni diffusion to the NiSi interface. Therefore, achieving high activated impurity concentration at the interface and minimizing excessive formation of NiSi2 are vital in achieving low Rco with good Rs.

The main problem encountered with current SBH engineering techniques is that the peak or large amount of the impurity (e.g., N, Cl, As, B, In) is in the bulk of the NiSi material (i.e., away from the NiSi/Si interface), which is not effective in lowering SBH. Moreover, because there is a need to activate this impurity and the rapid thermal anneal (RTA) temperature needed to achieve NiSi formation may not help achieve high active concentration. When N is used, it retards the diffusion of Ni resulting in a thicker NiSi2 at the interface and increases Rs.

Accordingly, there is a need for an improved fabrication process (and resulting devices) that lower SBH and Rco to improved device performance. Also needed is a new process for more effective SBH engineering that (1) minimizes impurity/dopant/metal diffusion, (2) achieves peak or high impurity/dopant/metal concentration at the silicide-semiconductor interface, (3) achieves high activation of impurity/dopant/metal at the silicide-semiconductor interface, and (4) minimizes the formation of high resistance silicide at the silicide-semiconductor interface.

SUMMARY

In accordance with one embodiment, there is provided a method of forming a semiconductor device. The method includes providing a semiconductor substrate with dopants of a first conductivity type; forming a field-effect transistor (FET) structure on the substrate, the FET structure including a gate structure and first and second source/drain (S/D) regions with dopants of a second conductivity type; depositing metal on the first and second S/D regions; performing a thermal annealing process to form metal silicide within the first and second S/D regions; after metal silicide is formed, implanting an impurity in the first and second S/D regions; and after impurity implantation, performing a spike annealing process.

In another embodiment, there is provided a method of forming a semiconductor device. The method includes providing a semiconductor substrate with dopants of a first conductivity type, and forming a field-effect transistor (FET) structure on the substrate, the FET structure including a gate structure and first and second source/drain (S/D) regions with dopants of a second conductivity type. Metal is deposited on the first and second S/D regions and metal silicide is formed within the first and second S/D regions by a thermal annealing process. Prior to depositing the metal, an impurity is implanted in the first and second S/D regions and after performing the thermal annealing process, a spike annealing process is performed.

In accordance with another embodiment, there is provided a semiconductor device having a semiconductor substrate of a first conductivity type, The device includes a field-effect transistor (FET) structure formed on the substrate, wherein the FET structure includes a gate stack including a gate dielectric and a gate electrode, a first source/drain (S/D) region and a second S/D region each of a second conductivity type, each of the S/D regions including a contact region including metal silicide disposed therein, a segregation region and a junction region, and an impurity disposed in the first and second S/D regions, wherein the impurity is higher in concentration in the segregation region than in the contact region and the junction region.

In yet another embodiment, there is provided a method of forming a field-effect transistor (FET) structure having reduced contact resistance. The method includes forming a gate structure on a semiconductor substrate having dopants of a first conductivity type, the gate structure including a gate dielectric and a gate; forming a first source/drain (S/D) region having dopants of a second conductivity type and positioned proximate the gate structure; forming a second S/D region having dopants of the second conductivity type and positioned proximate the gate structure; forming metal on the first and second S/D regions; performing a thermal annealing process to form metal silicide within contact regions in the first and second S/D regions; removing unreacted metal; after removing unreacted metal, implanting an impurity in the first and second S/D regions; and after impurity implantation, performing a spike annealing process.

Other technical features may be readily apparent to one skilled in the art from the following figures, descriptions, and claims.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
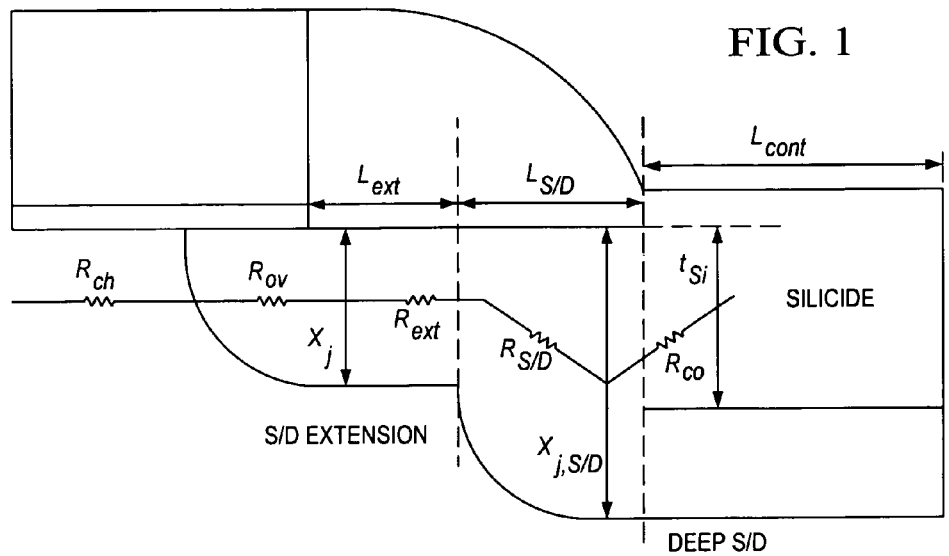
FIG. 1 is a diagram of a portion of a CMOS device illustrating series resistance components.
Figure 2A:
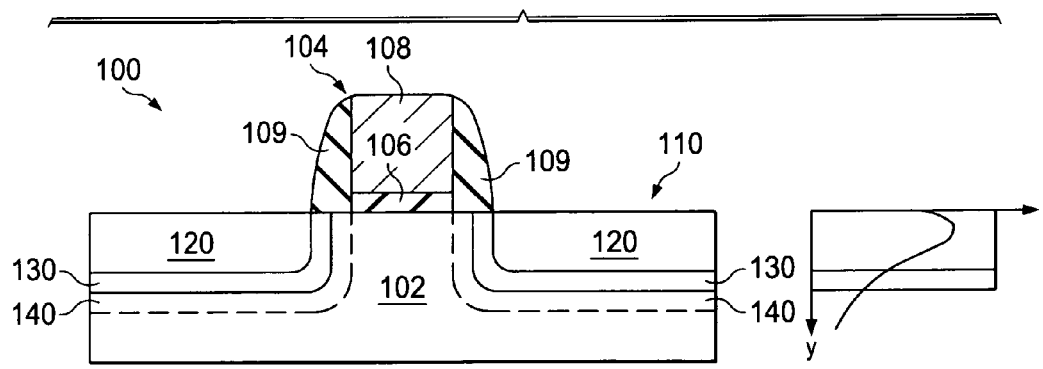
FIG. 2A is a cross-sectional view depicting a field-effect transistor (FET) and its impurity concentration in the contact region using a conventional prior art fabrication process described in FIG. 2B.

Referring to FIG. 2A, there is depicted a cross-sectional view of a prior art FET semiconductor device 100 formed on a substrate 102. The FET device 100 can be structured as either an n-type or p-type FET.

The FET 100 includes a gate stack 104 having a gate dielectric 106, a gate 108 and sidewall spacers 109. Two n-type (or p-type) regions form the source/drain (S/D) regions 110, which include either n-type (or p-type) dopants (while the substrate 102 includes dopants of an opposite conductivity type). Each of the S/D regions 110 includes a contact region 120, a segregation (or interface) region 130, and a junction region 140. The contact region 120 is formed to include nickel silicide (NiSi). The segregation region 130 is formed to include one or more impurities, dopants and/or metals (and either of these shall be referred to as an "impurity" hereinafter, and refers to both singular and plural). The junction region 140 forms part of the S/D region 110 and is separated from the NiSi region 120 by the segregation region 130. The segregation region 130 provides an interface between the NiSi region 120 and the junction region 140 and is intended to reduce contact resistance, and thus series resistance, in the device 100.

The following description and accompanying FIG. 2A illustrate a general and conventional process by which the prior art device 100 is typically fabricated. Conventional CMOS processing is performed up to silicide (contact) formation. At this point, SBH engineering is performed by implanting an impurity, such as nitrogen (N), into the S/D regions 110. After N implantation, a nickel alloy (Ni) is deposited on the surface of the substrate in the S/D regions 110, and a rapid thermal anneal (RTA) process is carried out at a low temperature (e.g., 300 C, 30 s). A low temperature is used to minimize excessive silicide formation, and at this stage, some $Ni_2Si$ is formed. Unreacted Ni is removed. To more fully convert the $Ni_2Si$ to NiSi, a second RTA process is performed (e.g., 500 c, spike).

Because nitrogen retards Ni diffusion, the region near the interface between the silicide region 120 and the junction region 140 is silicon rich. As a result, nickel disilicide ($NiSi_2$) is formed. The nitrogen in the segregation/interface region 130 reduces SBH in that region (de-pins the Fermi-level). SBH is reduced further by the $NiSi_2$ region. By lowering SBH, the contact resistance (Rco) is reduced, which in turn reduces series resistance. However, because of the higher sheet resistance of the $NiSi_2$ (as compared to NiSi) and the thickness increase, the Rs is greatly increased. As a result, the implanted nitrogen impurities and RTA results in the formation of a thick segregation region 130 of $NiSi_2$ which increases Rs. This resulting increase in resistance reduces or offsets the beneficial reduction in Rco.

Referring again to FIG. 2A, there is shown a chart (concentration—depth) illustrating the impurity concentration, in this case nitrogen, in the contact, segregation and junction regions 120, 130, 140 of the S/D regions 110.

Figure 3:
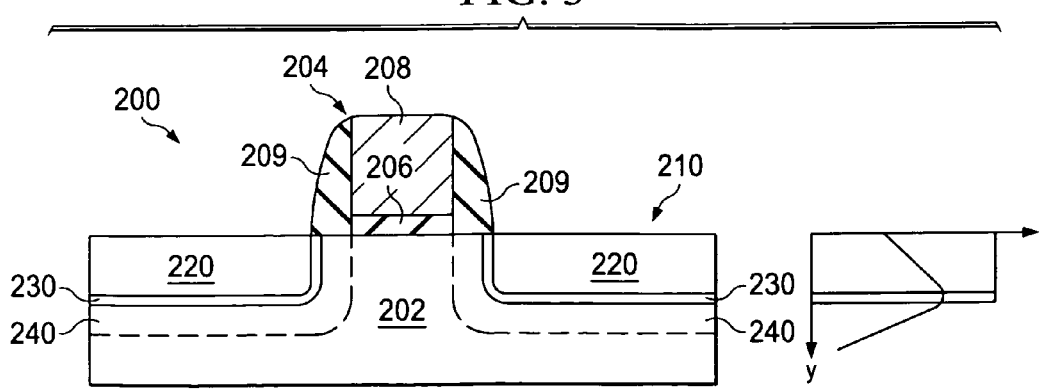
FIG. 3 is a cross-sectional view depicting a FET and its impurity concentration in the contact region fabricated using a method or process in accordance with the present disclosure.

Now turning to FIG. 3, there is depicted a cross-sectional view of a FET semiconductor device 200 formed on a substrate 202 in accordance with the present disclosure. The FET device 200 can be structured as either an n-type or p-type FET. As will be appreciated, the structures and regions shown in the FIGURES are not drawn to scale or actual form, and are for illustrative purposes.

Substrate 202 may include, for example, silicon, silicon-on-insulator (SOI), or other suitable semiconductor substrate materials, now known or later developed. The substrate 202 may include silicon (e.g., n-type, p-type, or no type) provided in a single well or twin-well process, and may further include an epitaxial layer.

The FET 200 includes a gate stack 204 having a gate dielectric 206, a gate electrode 208 and sidewall spacers 209. Two n-type (or p-type) regions form the source/drain (S/D) regions 210, which include either n-type (or p-type) dopants (while the substrate 202 includes dopants of an opposite conductivity type). Each of the S/D regions 210 includes a contact region 220, a segregation (or interface) region 230, and a junction region 240.

The contact region 220 is formed to include a metal silicide. As will be appreciated, the metal silicide may include any suitable metal, and in one specific embodiment, is NiSi. The segregation. region 230 is formed to include one or more impurities. Examples of such impurities may include As, B, In, Sb, N, Cl, S, Se, Al, Dy, Yb, Yt, and the like. In two specific embodiments, the impurity is nitrogen or chlorine. The junction region 240 forms part of the S/D region 210 and is separated from the metal silicide region 220 by the segregation region 230. The segregation region 230 provides an interface between the contact region 220 and the junction region 240 and is intended to reduce contact resistance, and thus series resistance, in the device 200.

Referring again to FIG. 3, there is shown a chart (concentration—depth) illustrating the impurity concentration in the contact, segregation and junction regions 220, 230, 240 of the S/D regions 210 in accordance with the present disclosure.

As will be understood, most of the semiconductor device 200 may be formed using conventional processes, and a method or process will be described below by which the device 200 may be fabricated to achieve reduced series resistance and improve device performance.

Figure 4:
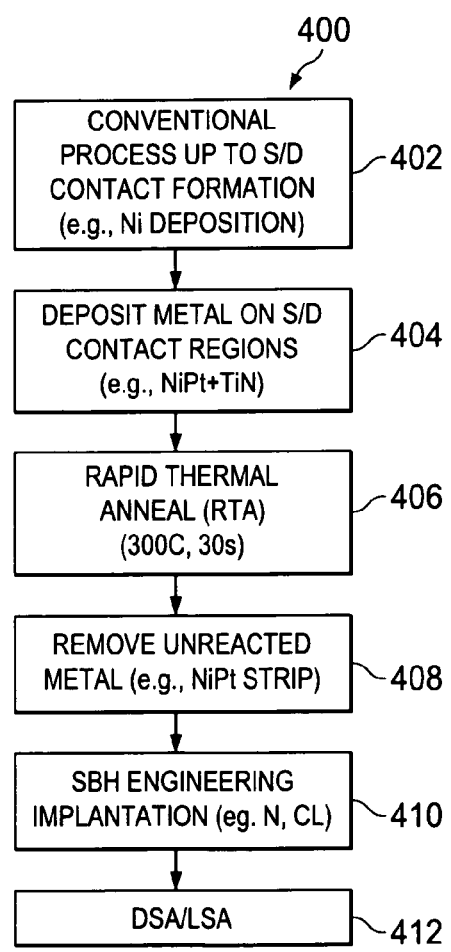
FIG. 4 illustrates a method or process in accordance with the present disclosure.

Now referring to FIG. 4, there is illustrated a method or process 400 of fabricating the FET device 200 in accordance with the present disclosure. In general terms, this new process provides more effective SBH engineering of the device by minimizing impurity diffusion, achieving peak or high impurity concentration and/or high impurity activation at the interface (segregation region 230) between the contact region 220 and the junction region 240 within the S/D regions 210.

The process 400 includes conventional processing steps up to the formation of the source/drain contacts (at step 402). Metal (including metal alloy(s) or compounds) is deposited on at least a portion of the source/drain regions 210 (step 404). The metal may be any suitable metal to form a metal silicide in the S/D regions 210, and in specific embodiments, may be nickel (Ni), a nickel-platinum alloy, titanium, or titanium nitride, or any combination of these.

A rapid thermal anneal (RTA) process is performed that causes the deposited metal to react with the silicon in the S/D regions to form metal silicide in the contact region 220 (step 406). Typically, at this stage some $Ni_2Si$ is also formed. This RTA process may be performed at a suitable temperature and time, such as at 300 degrees Celsius and for thirty seconds. Other annealing parameters may be utilized. After annealing, unreacted metal is removed (step 408) by a suitable process, such as etching.

After the unreacted metal is removed, an impurity is implanted in the S/D regions (step 410). This may also be referred to as schottky barrier height (SBH) engineering implantation (for decreasing the barrier height). This implantation increases peak concentration around the silicide-semiconductor interface (in the segregation region 230) and reduces the concentration in the bulk silicide region. Examples of suitable impurities may include As, B, In, Sb, N, Cl, S, Se, Al, Dy, Yb, Yt, and the like. In one embodiment, the impurity is nitrogen. During the implantation process, the implanted impurities are imparted with an energy level in an effort to generate peak impurity levels at or near the interface between the NiSi and the Si. The implant energy will depend on the thickness of the NiSi and the angle will depend on the amount of lateral encroachment. The goal is to produce a specific distribution (depth) into the S/D regions 210 as near to that shown in FIG. 3. Implant energy levels may range from a few eV to a few hundred keV, depending on the targeted silicide thickness to be formed and the implant species. Implant dosage may range from about $1 \times 10^{13}$ $cm^2$ to $1 \times 10^{16}$ $cm^2$, depending on the implant species, as well.

In addition, cluster, molecular or plasma implants may be employed to form sharper and/or shallower impurity profiles.

Next, a spike annealing process is performed that converts $Ni_2Si$ to NiSi, which also minimizes impurity diffusion and provides high activation (step 412). The spike anneal process may be a laser spike annealing (LSA) process or a dynamic spike annealing (DSA) process, or other known spike anneal process, and may be a flash anneal. LSA and DSA work in such a way that it ramps up the temperature of the applied region from a floor (e.g., ambient) temperature to the intended temperature in a short period of time. The main difference between LSA and DSA is that DSA has a shorter dwell time, i.e., this process is able to achieve the intended temperature in a shorter time period than LSA. Thus, a "spike anneal" process is described as an anneal process in which the temperature is raised to the intended temperature in a short period of time, such as less than about 5 seconds, and in some embodiments less than about 1 second. Due to the short duration and meta-stable state induced by LSA/DSA, diffusion is minimized and the impurity is highly activated—aiding in the surface passivation of dangling bonds and/or impurity segregation at the interface (between the contact region 220 and the junction region 240) which lowers SBH.

Utilization of an impurity like nitrogen results in concentration peaks at the silicide-semiconductor interface, and with utilization of LSA/DSA, metal diffusion is retarded by the nitrogen only in a small (thin) region at the interface. See, FIGS. 3. This minimizes excessive formation of $NiSi_2$ and results in a thinner layer of high resistivity $NiSi_2$ at the interface.

The above described method 400 aids in the fabrication of the FET structure 200 through reductions in contact resistance (by decreasing SBH) and overall silicide sheet resistivity. In sum, this reduces the series resistance of the device 200 and improves device performance.

Now referring to FIGS. 5-8, there are illustrated alternative embodiments of processes for fabricating the semiconductor device 4 that are intended to achieve some or all of the same desired effects produced by the process 400 shown in FIG. 4.

Figure 2B:
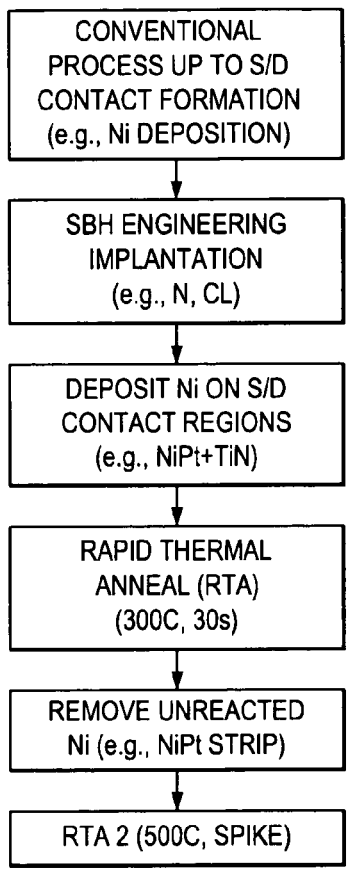
Figure 5:
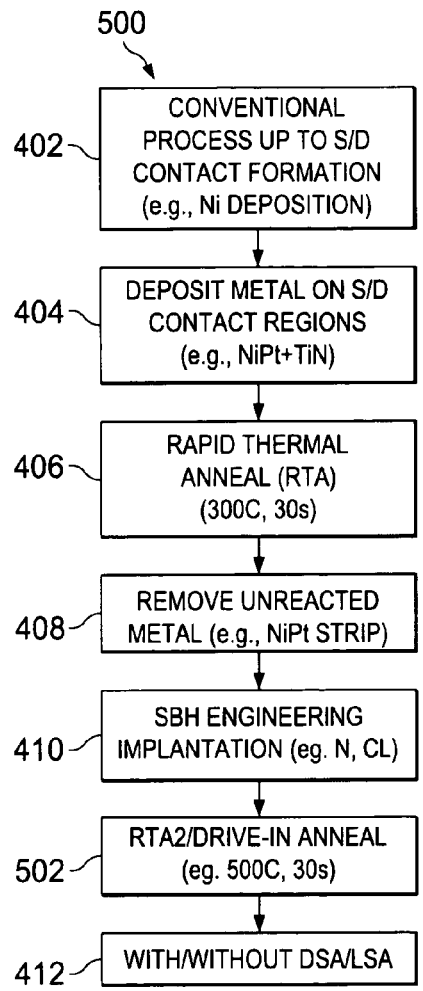
FIGS. 5-8 illustrate alternative embodiments of a method or process in accordance with the present disclosure.
Figure 6:
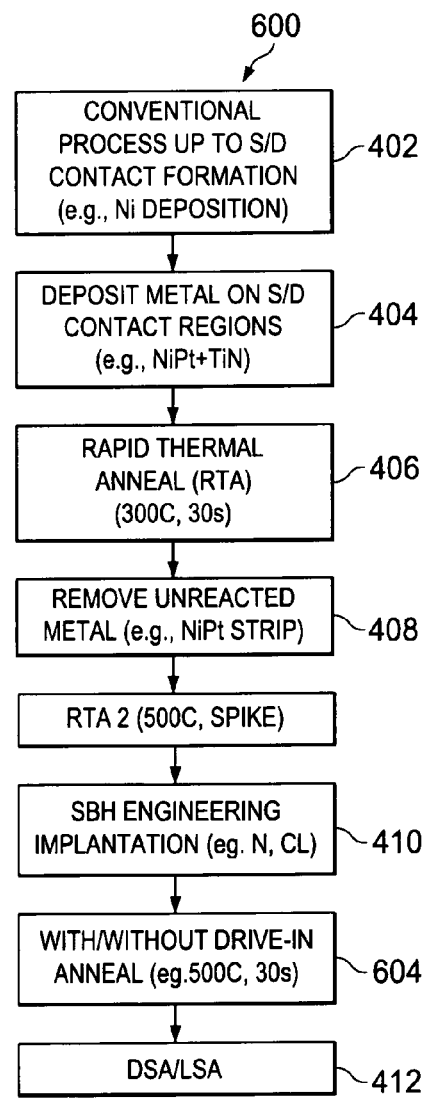

Turning to FIG. 5, a process 500 includes the steps 402 thru 410, and further includes a second RTA process performed after impurity implantation (at a step 502), such as a drive-in anneal, which may be at 500 degrees Celsius for thirty seconds. After the second RTA process, the spike anneal process 412 may either be performed or may be omitted. Now turning to FIG. 6, a process 600 includes the steps 402 thru 408, and further includes a second RTA process performed prior to impurity implantation (at a step 602), such as at 500 degrees Celsius with spike. After the second RTA process, the impurity is implanted (step 412). After impurity implantation, another RTA/drive-in anneal process may optionally be performed (at a step 604), and then the spike anneal process 412 is performed. Both of the processes 500, 600 provide higher activation of the impurity and minimize impurity diffusion, resulting in a smaller or thinner segregation region 230. As will be appreciated, the processes 400, 500 and 600 perform impurity implantation at a distinctly different point than that performed in the prior art process (see FIG. 2B)—it is performed after deposition of the metal and formation of the contact regions (and after removal of excess metal).

As will be appreciated, the processes 400, 500 and 600 perform impurity implantation at a distinctly different point than that performed in the prior art process (see FIG. 2B)—it is performed after deposition of the metal and formation of the contact regions (and after removal of excess metal).

Figure 7:
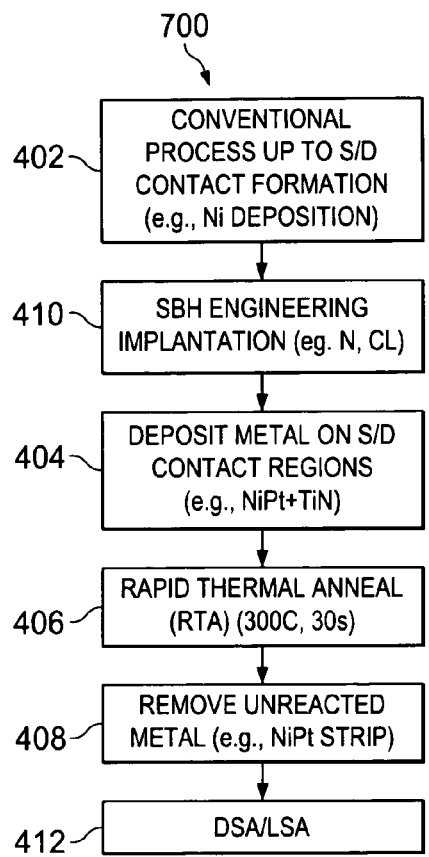
Figure 8:
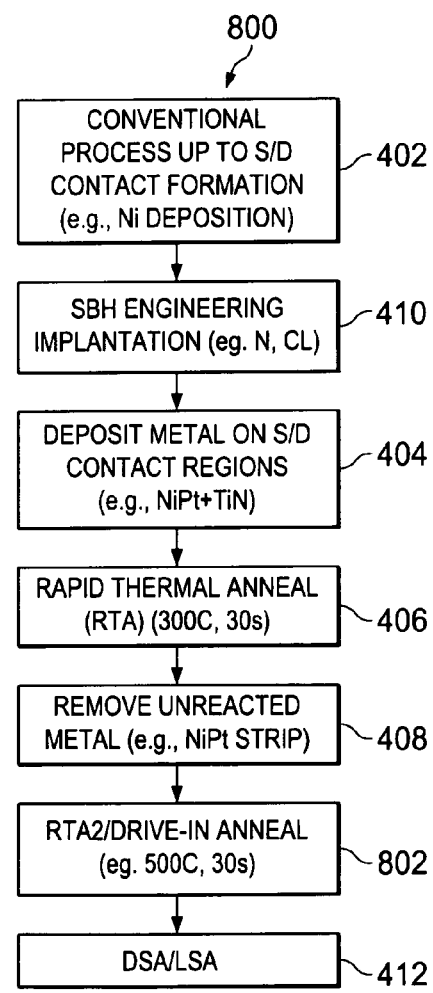

Turning now to FIG. 7, a process 700 is illustrated—where impurity implantation (step 410) step is performed prior to metal deposition (step 404). The main difference as compared to the prior art process is that after the metal is removed (at step 408), the spike anneal process 412 is then performed. Now turning to FIG. 8, a process 800 is illustrated that is essentially the same as the process 700 except for inclusion of a second RTA process (at a step 802), such as a drive-in anneal which may be at 500 degrees Celsius for thirty seconds, is performed prior to the spike anneal process 412. Both of the processes 700, 800 provide higher activation of the impurity resulting in a lower SBH.

As will be appreciated, the processes 700 and 800 perform impurity implantation at essentially the same point as the prior art process (see FIG. 2B), however, additional steps are performed after the removal of excess metal that was formed during contact formation The order of steps or processing can be changed or varied form that described above, unless otherwise described above (or in the claims below). It will be understood that well known process have not been described in detail and have been omitted for brevity. Although specific steps, insulating materials, conductive materials and apparatuses for depositing and etching these materials may have been described, the present disclosure may not limited to these specifics, and others may substituted as is well understood by those skilled in the art.

It may be advantageous to set forth definitions of certain words and phrases used throughout this patent document. The terms "include" and "comprise," as well as derivatives thereof, mean inclusion without limitation. The term "or" is inclusive, meaning and/or. The phrases "associated with" and "associated therewith," as well as derivatives thereof, mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of forming a semiconductor device, the method comprising:
    providing a semiconductor substrate with dopants of a first conductivity type;
    forming a field-effect transistor (FET) structure on the substrate, the FET structure including a gate structure and first and second source/drain (S/D) regions with dopants of a second conductivity type;
    depositing metal on the first and second S/D regions;
    performing a thermal annealing process to form metal silicide within the first and second S/D regions;
    after metal silicide is formed, implanting an impurity in the first and second S/D regions; and
    after impurity implantation, performing a spike annealing process comprising ramping up temperature to an intended temperature in less than about 5 seconds.

2. The method in accordance with claim 1 wherein the impurity comprises nitrogen.

3. The method in accordance with claim 1 wherein the metal comprises nickel.

4. The method in accordance with claim 1 wherein the spike annealing process is a laser spike annealing (LSA) process.

5. The method in accordance with claim 4 further comprising:
    after impurity implantation and prior to the spike annealing process, performing a second thermal annealing process.

6. The method in accordance with claim 5 wherein the impurity comprises nitrogen and the metal comprises nickel.

7. The method in accordance with claim 4 further comprising:
    removing excess unreacted deposited metal; and
    after removing excess unreacted metal and prior to impurity implantation, performing a second thermal annealing process.

8. The method in accordance with claim 7 wherein the impurity comprises nitrogen and the metal comprises nickel.

9. A method of forming a semiconductor device, the method comprising:
    providing a semiconductor substrate with dopants of a first conductivity type;
    forming a field-effect transistor (FET) structure on the substrate, the FET structure including a gate structure and first and second source/drain (S/D) regions with dopants of a second conductivity type;
    depositing metal on the first and second S/D regions;
    performing a thermal annealing process to form metal silicide within the first and second S/D regions;
    prior to depositing the metal, implanting an impurity in the first and second S/D regions; and
    after performing the thermal annealing process, performing a spike annealing process comprising ramping up temperature to an intended temperature in less than about 5 seconds.

10. The method in accordance with claim 9 further comprising:
    prior to spike annealing, performing a second thermal annealing process.

11. A method of forming a field-effect transistor (FET) structure having reduced contact resistance, the method comprising:
    forming a gate structure on a semiconductor substrate having dopants of a first conductivity type, the gate structure including a gate dielectric and a gate;
    forming a first source/drain (S/D) region having dopants of a second conductivity type and positioned proximate the gate structure;
    forming a second S/D region having dopants of the second conductivity type and positioned proximate the gate structure;
    forming metal on the first and second S/D regions;
    performing a thermal annealing process to form metal silicide within contact regions in the first and second S/D regions;
    removing unreacted metal;
    after removing unreacted metal, implanting an impurity in the first and second S/D regions; and
    after impurity implantation, performing a spike annealing process comprising ramping up temperature to an intended temperature in less than about 5 seconds.

12. The method in accordance with claim 11 wherein the impurity comprises nitrogen.

13. The method in accordance with claim 11 wherein the metal comprises nickel.

14. The method in accordance with claim 11 wherein the spike annealing process is a laser spike annealing (LSA) process.

15. The method in accordance with claim 11 wherein the S/D regions include a contact region including metal silicide disposed therein, a segregation region and a junction region, and the impurity disposed in the first and second S/D regions is higher in concentration in the segregation region than in the contact region and the junction region.

* * * * *